(12) United States Patent
Oh et al.

(10) Patent No.: US 9,646,699 B2
(45) Date of Patent: May 9, 2017

(54) DIFFERENTIAL WRITING FOR LIFE EXTENSION OF PORTIONS OF A MEMORY DEVICE

(71) Applicant: EMPIRE TECHNOLOGY DEVELOPMENT LLC, Wilmington, DE (US)

(72) Inventors: Hyun Oh Oh, Gyeonggi-do (KR); Jin Sam Kwak, Gyeonggi-do (KR); Ju Hyung Son, Gyeonggi-do (KR)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 190 days.

(21) Appl. No.: 14/404,002

(22) PCT Filed: Apr. 30, 2014

(86) PCT No.: PCT/US2014/036085
§ 371 (c)(1),
(2) Date: Nov. 25, 2014

(87) PCT Pub. No.: WO2015/167509
PCT Pub. Date: Nov. 5, 2015

(65) Prior Publication Data
US 2016/0267986 A1 Sep. 15, 2016

(51) Int. Cl.
*G11C 16/10* (2006.01)
*G06F 11/10* (2006.01)
(Continued)

(52) U.S. Cl.
CPC .......... *G11C 16/10* (2013.01); *G06F 11/1076* (2013.01); *G11C 11/5628* (2013.01);
(Continued)

(58) Field of Classification Search
CPC ..... G11C 16/10; G11C 16/26; G11C 11/5642; G11C 29/52; G11C 11/5628
See application file for complete search history.

(56) References Cited

U.S. PATENT DOCUMENTS 6,219,282 B1 * 4/2001 Tanaka .................. G11C 16/26
365/185.33
7,865,805 B1 1/2011 Gallagher et al.
(Continued)

OTHER PUBLICATIONS

Cai, Y., et al, "Threshold voltage distribution in MLC NAND flash memory: characterization, analysis, and modeling," Proceeding Date '13 Proceedings of the Conference on Design, Automation and Test in Europe, pp. 1285-1290 (2013).
(Continued)

*Primary Examiner* — Harry W Byrne
*Assistant Examiner* — Ajay Ojha
(74) *Attorney, Agent, or Firm* — Amin, Turocy & Watson, LLP

(57) ABSTRACT

Technologies are generally described that relate to differential writing for life extension of portions of non-volatile memory that have a likelihood of error that satisfies a defined condition. An example method may include determining that at least two components of a memory device satisfy a defined condition; writing to a first component of the at least two components with first data having a first representation. The method may also include writing to a second component of the at least two components with second data having a second representation different from the first representation, wherein the second data comprises at least a portion that is bit inverted relative to the first data.

20 Claims, 12 Drawing Sheets

(51) Int. Cl.
*G11C 16/34* (2006.01)
*G11C 29/50* (2006.01)
*G11C 29/52* (2006.01)
*G11C 16/26* (2006.01)
*G11C 11/56* (2006.01)

(52) U.S. Cl.
CPC .......... *G11C 11/5642* (2013.01); *G11C 16/26* (2013.01); *G11C 16/349* (2013.01); *G11C 29/50004* (2013.01); *G11C 29/52* (2013.01); *G11C 11/56* (2013.01)

(56) References Cited

U.S. PATENT DOCUMENTS

| 8,156,403 | B2 | 4/2012 | Shalvi et al. | |
|---|---|---|---|---|
| 8,560,922 | B2 | 10/2013 | Bivens et al. | |
| 2007/0180346 | A1 | 8/2007 | Murin | |
| 2012/0044762 | A1 | 2/2012 | Rotbard et al. | |
| 2012/0127804 | A1 | 5/2012 | Ong et al. | |
| 2013/0094288 | A1* | 4/2013 | Patapoutian | G11C 16/06 365/185.03 |
| 2014/0056068 | A1* | 2/2014 | Strasser | G06F 11/1048 365/185.03 |
| 2015/0179265 | A1* | 6/2015 | Teitel | G11C 16/08 365/185.03 |
| 2016/0162355 | A1* | 6/2016 | Mizrachi | G11C 29/52 714/57 |

OTHER PUBLICATIONS

International search report and written opinion for PCT application No. PCT/US2014/36085 mailed on Sep. 18, 2014.

Wang, C., and Wong, W., "Extending the Lifetime of NAND Flash Memory by Salvaging Bad Blocks," IEEE, Design, Automation & Test in Europe Conference & Exhibition (Date), 2012, pp. 260-263 (Mar. 12-16, 2012).

* cited by examiner

|  | E0 | E1 | E0÷E1 | IMPROVEMENT |
|---|---|---|---|---|
| SINGLE | 0.0227 | 0.0667 | 0.0894 |  |
| DOUBLE | 0.0023 | 0.0169 | 0.0192 | 0.0% |
| DIFFERENTIAL | 0.0067 | 0.0067 | 0.0134 | 30.2% |

FIG. 5

| INFORMATION TO BE STORED IN MEMORY (ORIGINAL DATA) | BLOCK 1 (ORIGINAL DATA) | BLOCK 2 (INVERTED BIT DATA) | DIFFERENCE (BLOCK 1 – BLOCK 2) | SUMMATION (BLOCK 1 + BLOCK 2) |
|---|---|---|---|---|
| "11" | 0 VOLTS ("11") | 2 VOLTS ("00") | -2 VOLTS | 2 VOLTS |
| "01" | 1 VOLTS ("01") | 3 VOLTS ("10") | -2 VOLTS | 4 VOLTS |
| "00" | 2 VOLTS ("00") | 0 VOLTS ("11") | 2 VOLTS | 2 VOLTS |
| "10" | 3 VOLTS ("10") | 1 VOLT ("01") | 2 VOLTS | 4 VOLTS |

FIG. 7

DIFFERENTIAL WRITING FOR LIFE EXTENSION OF PORTIONS OF A MEMORY DEVICE

CROSS-REFERENCE TO RELATED APPLICATION

The present application is a U.S. National Stage filing under 35 U.S.C. §371 of International Application No. PCT/US14/36085, filed on Apr. 30, 2014, and entitled "DIFFERENTIAL WRITING FOR LIFE EXTENSION OF PORTIONS OF A MEMORY DEVICE," the disclosure of which is incorporated herein by reference in its entirety.

TECHNICAL FIELD

The subject disclosure relates generally but not exclusively to differential writing to portions of a memory device for memory life extension.

BACKGROUND

Unless otherwise indicated herein, the materials described in this section are not prior art to the claims in this application and are not admitted to be prior art by inclusion of this section.

In general, block management in a solid-state drive (SSD) includes a block being classified as an error prone block and no longer used if the number of error prone cells in a block is over a limit of correction capability by the particular error correction coding (ECC) employed for the SSD. In some cases, an error prone block list is managed in a table. As the number of error prone cells increase, the number of error prone blocks increase accordingly. Resource waste and corresponding lack of efficiency result.

SUMMARY

In various, non-limiting embodiments, systems, devices, methods and/or computer-readable storage media that facilitate differential writing to portions of a memory device for memory life extension are described herein.

In some embodiments, methods may include determining, by a device including a processor, that at least two components of a memory device satisfy a defined condition, and writing to a first component of the at least two components with first data having a first representation. The method may also include writing to a second component of the at least two components with second data having a second representation different from the first representation. The second data may include at least a portion that is bit inverted relative to the first data.

In some embodiments, devices are described. For example, a device may include an analysis and error prone portion classification configured to determine that at least two components of a memory device satisfy a defined condition, and a writing component. The writing component may be configured to write to a first component of the at least two components with first data having a first representation. The writing component may also be configured to write to a second component of the at least two components with second data having a second representation, wherein at least a portion of the second data is bit inverted relative to the first data.

In another embodiment, yet another method is described. The method may include determining, by a device including a processor, that at least a first apportionment of a page of a block of the memory device and a second apportionment of the page satisfy a defined condition. The method may also include dividing data into a first portion of data and a second portion of data, wherein the first portion of data and the second portion of data are sized to be stored in the first apportionment of the page and the second apportionment of the page, respectively. The method may also include writing the first portion of data to the first apportionment of the page and writing the second portion of the data to the second apportionment of the page.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, various non-limiting embodiments are further described with reference to the accompanying drawings in which:

FIG. 5 illustrates an example set of simulation results for the device of FIG. 1 configured to facilitate differential writing to portions of memory device for memory life extension in accordance with one or more embodiments described herein;

FIG. 7 illustrates an example table depicting example values for differential reading and summation-based reading of data and corresponding performance results for MLC memory devices in accordance with one or more embodiments described herein;

DETAILED DESCRIPTION

Figure 1:
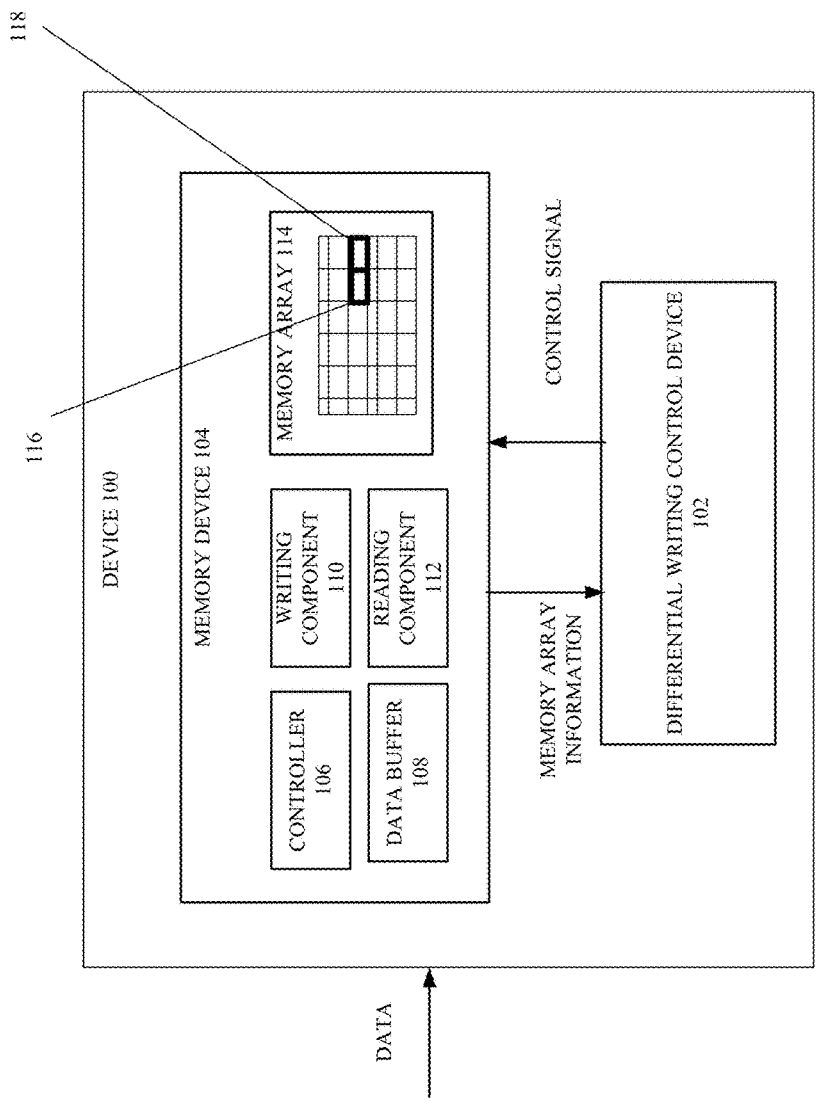
FIG. 1 illustrates an example block diagram of a device including a differential writing control (DWC) device and memory device configured to facilitate differential writing to portions of memory device for memory life extension in accordance with one or more embodiments described herein.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, may be arranged, substituted, combined, separated, and designed in a wide variety of different configurations, all of which are explicitly contemplated herein.

For non-volatile memory devices (e.g., flash memory devices), as time goes on and the amount of use increases, bit errors that are too extensive to be corrected with ECC may occur during data writing and reading. In some cases, error prone block management in a solid-state drive (SSD) includes classification of a portion of a memory device as an error prone portion and removal of the portion from use if the number of cells in a block that are error prone exceed a particular value.

In some cases, an error prone block list may be managed in a table. As the number of error prone cells increases due to the endurance error caused by expiration of operating life, the number of error prone blocks increases and the operating life of the memory device is shortened.

One or more of the embodiments described herein may apply to different types of memory device. In a memory device, each analog memory cell typically includes a transistor. The transistor holds a certain amount of electric charge, which represents the information stored in the memory cell. The electric charge written into a given cell influences the threshold voltage of the cell. The threshold voltage of the cell may be the amount of voltage to be applied to the cell for the cell to conduct current.

In one embodiment, the memory device may be a single-level cell (SLC) memory device, which may store a single bit of information in each memory cell. Typically, the range of possible threshold voltage values of the cell is divided into two regions. A voltage value within one of the regions represents a "0" bit value and/or a voltage value within the other region represents a "1" bit value.

Another type of memory device may be a multi-level cell (MLC) memory device, which may store two bits per memory cell. In MLC memory, the range of threshold voltages may be divided into more than two regions, with each region representing more than one bit. For example, in one embodiment, the range of possible threshold voltage values of the cell may be divided into four regions. A voltage value within a first region may represent a "00" value, a voltage value within a second region may represent a "01" value, a voltage value within a third region may represent a "11" value and/or voltage value within a fourth region may represent a "10" value.

The voltage distribution may be one factor contributing to error during writing and/or reading of data. For example, for an SLC memory device, the distribution of voltage values for which a "0" bit value is determined are different from the distribution of voltage values for which a "1" bit value is determined. Similarly, for an MLC memory device, the distribution of voltage values for which different bit values (e.g., "00," "01," "11," and/or "10") are determined are different. Therefore, in some cases, to be adaptive to the various different distributions, the threshold voltage, which is the reference voltage for deciding whether a bit value is "0" or "1," may also be adaptively changed. However, adaptation typically requires frequent and inconvenient monitoring of the distribution of voltage values. Further, the accuracy of adaptation is typically limited. As such, a fixed threshold voltage or an incorrectly adapted threshold voltage may result in different error rates for level "0" bit mappings and level "1" bit mappings, which further increases the overall error rate. Simple repetition of the same data in memory device also cannot resolve the issues that typically call for threshold voltage to be adaptive, and the corresponding difficulties with attempting to design a system that employs adaptive threshold voltage values.

Accordingly, one or more embodiments described herein may advantageously extend the lifespan of error prone portions of a memory device. Specifically, the embodiments store data in one or more error prone portions that would typically be removed from use due to likelihood of errors that are too extensive for correction via ECC. Further, in one or more embodiments, adaptation of the threshold voltage values to properly read stored data is unnecessary and the solution is therefore low-complexity and efficient. Additionally, one or more of the embodiments described herein may remove or reduce the likelihood of a biased error distribution, which typically occurs in error prone portions of memory device. As such, the error rate is favorable without incurring significant costs for implementation.

Furthermore, the embodiments described herein may be extended to any number of different types of applications that may employ non-volatile memory to extend operating life of a memory device notwithstanding data storage capacity may be reduced.

Turning now to the drawings, FIG. 1 illustrates an example block diagram of a device configured to facilitate differential writing to portions of memory device for memory life extension in accordance with one or more embodiments described herein. In the embodiment shown, a device 100 includes a DWC device 102 and a memory device 104. Memory device 104 and DWC device 102 may be electrically, communicatively and/or otherwise operably coupled to one another to perform one or more functions of a device 100.

Device 100 may identify two or more portions of memory device 104 that are error prone and perform differential writing of first and second data to the identified portions. The first data may be composed of bits and be the data intended to be stored in memory device 104 for later use while the second data may be a bit inverted form of the first data. For example, if first data is 0110, the second data may be 1001. Device 100 may read the first data and the second data, and determine the difference or the summation employing the first and second data in order to determine the original data intended to be stored in memory device 104. As such, device 100 may facilitate re-use of error prone portions of memory device 104 that would have typically been removed from usage and obtain efficient and accurate results with regard to later determining the information intended to be stored in the error prone portions of memory device 104.

Figure 2:
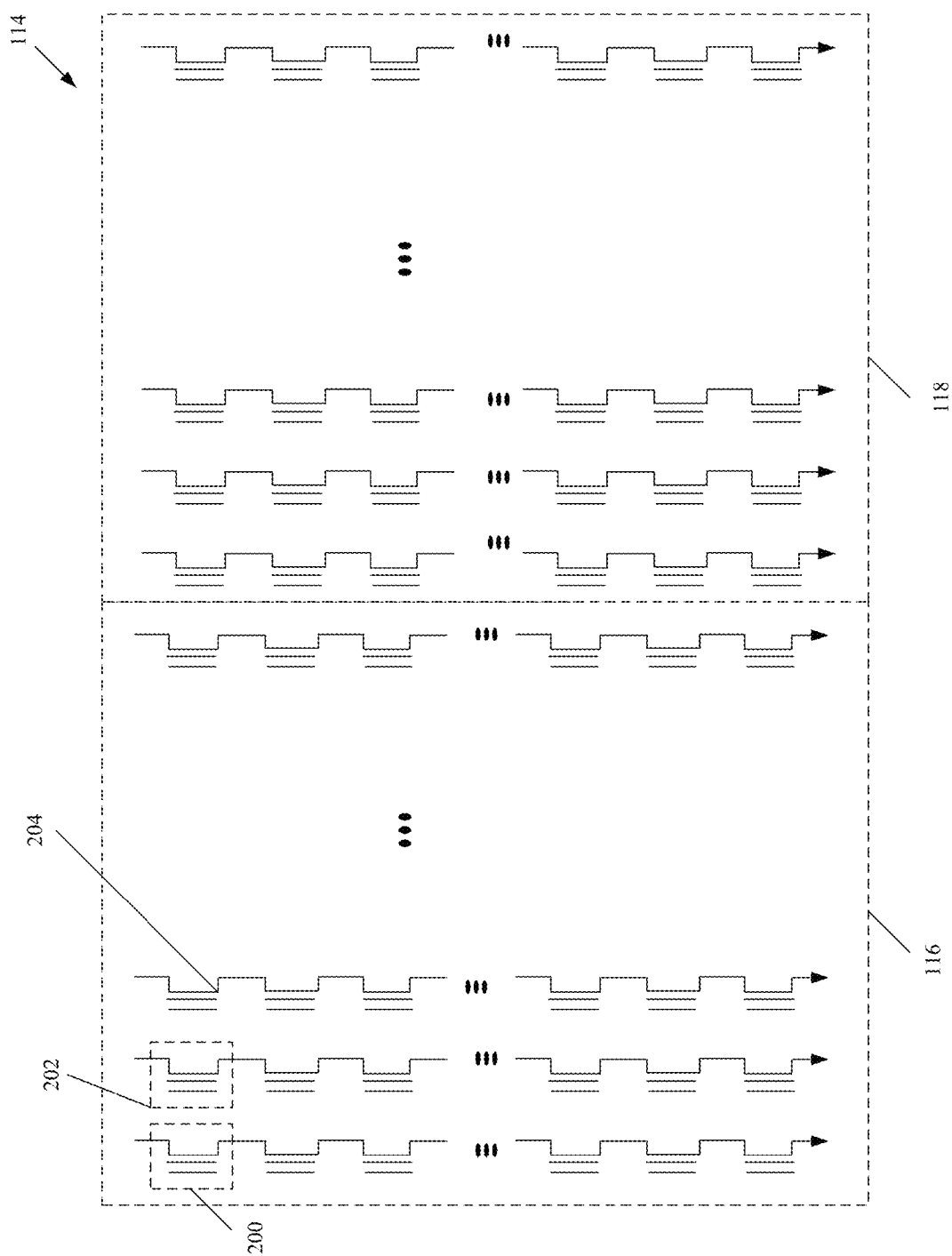
FIG. 2 illustrates an example block diagram of a portion of the memory device of FIG. 1 at which differential writing for memory life extension may be provided in accordance with one or more embodiments described herein.
Figure 3:
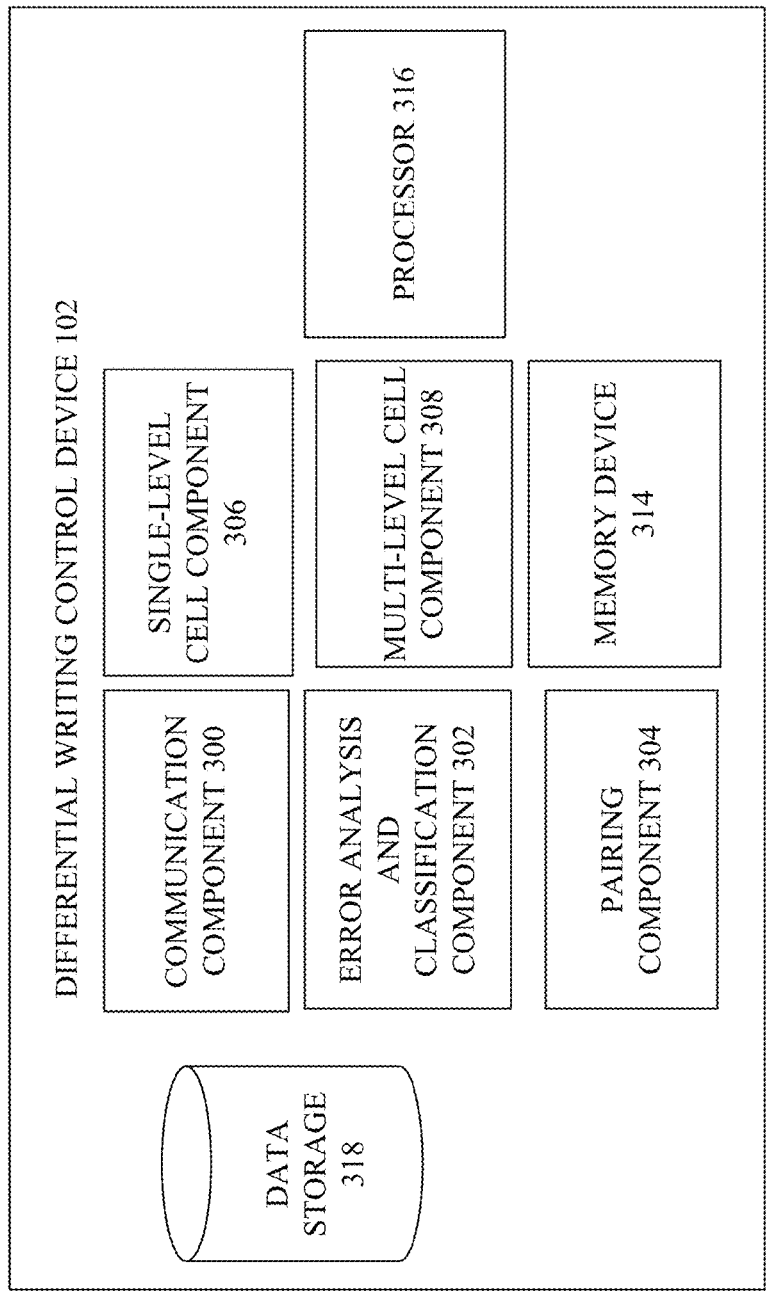
FIG. 3 illustrates an example block diagram of a DWC device of the device of FIG. 1 configured to facilitate differential writing to portions of memory device for memory life extension in accordance with one or more embodiments described herein.
Figure 8:
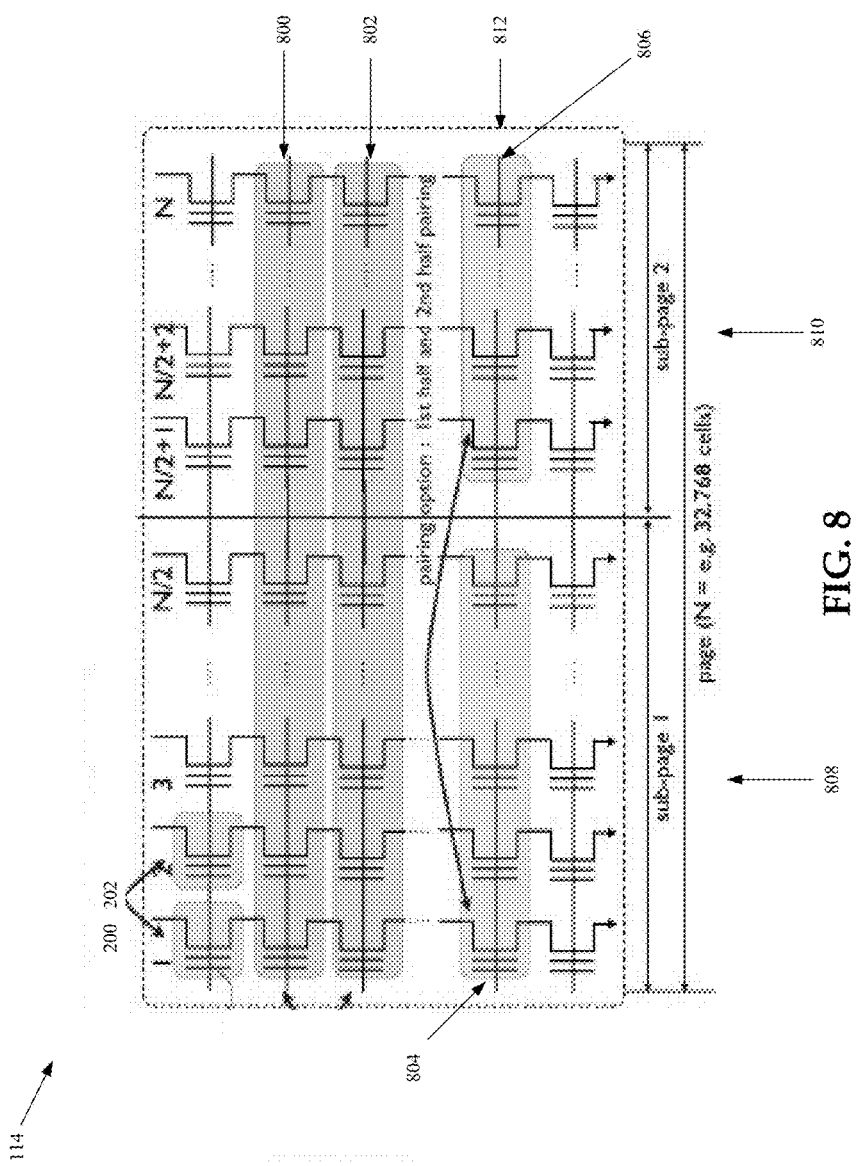
FIG. 8 illustrates an example block diagram of various different portions of the memory device of FIG. 1 for facilitation of differential writing to portions of memory device for memory life extension in accordance with one or more embodiments described herein.

Memory device 104 and DWC device 102 will be described in greater detail with reference to FIGS. 1, 2, 3 and 8. FIG. 2 illustrates an example block diagram of a portion of the memory device of FIG. 1 at which differential writing for memory life extension may be provided in accordance with one or more embodiments described herein. FIG. 3 illustrates an example block diagram of a DWC device of the device of FIG. 1 configured to facilitate differential writing to portions of memory device for memory life extension in accordance with one or more embodiments described herein. FIG. 8 illustrates an example block diagram of various different portions of the memory device of FIG. 1 for facilitation of differential writing to portions of memory device for memory life extension in accordance with one or more embodiments described herein. Repetitive description of like elements employed in respective embodiments of systems and/or apparatus described herein are omitted for sake of brevity.

As shown in FIG. 1, memory device 104 includes a controller 106, a data buffer 108, a writing component 110, a reading component 112 and/or a memory array 114. One or more of controller 106, data buffer 108, writing component 110, reading component 112 and/or memory array 114 may be electrically, communicatively and/or otherwise operably coupled to one another to perform one or more functions of memory device 104.

Controller 106 may be configured to control the flow of data to and/or from memory device 104. Data buffer 108 may be configured to temporarily store data received at memory device 104 from an input device (e.g., keyboard, microphone) and/or prior to output from memory device 104. As such, for example, received data may be temporarily stored in data buffer 108 prior to longer-term storage in memory array 114.

With reference to FIGS. 1 and 2, in various embodiments, memory array 114 may include a number of cells (e.g., cells 200, 202), with each cell composed of a transistor (e.g., a transistor 204) configured to hold an amount of electric charge to represent the data stored in the cell. As used herein, the terms "cell" and "memory cell" are used interchangeably. In some embodiments, memory array 114 may be SLC and therefore store a single bit of data/information in each of cells 200, 202. The bit is mapped to either "0" or "1." In other embodiments, memory array 114 may be MLC and therefore store two bits for each of cells 200, 202. In MLC embodiments, the values that may be represented per cell 200 or cell 202 are "00," "10," "11" and "01."

Turning to FIG. 2, different portions of memory array 114 are shown. Memory array 114 may be any number of different types of non-volatile memory. For example, in some embodiments, memory array 114 may be or include flash memory. As shown, memory array 114 may include a number of portions at different levels of granularity for storage of data. For example, a number of blocks make up memory array 114. For example, blocks 116, 118 are part of a number of blocks that compose memory array 114. In the embodiment shown, blocks 116, 118 are adjacent to one another. In various embodiments described herein, blocks 116, 118 need not be adjacent and may be at any number of different locations within memory array 114.

Turning to FIGS. 2 and 8, each of blocks 116, 118 are composed of pages (e.g., a page 800, a page 802, a page 812). In various embodiments, one or more of pages 800, 802, 812 may be composed of at least two sub-pages (e.g., sub-pages 808, 810). For example, one of the two sub-pages 808, 810 may be a first portion 804 (e.g., two thirds of the page) of page 812 and another of the two sub-pages may be a second portion 806 (one third of the page) of page 812. Any number of different apportionments to form sub-pages with different numbers of cells is possible. Further, in various embodiments, any number of sub-pages may be formed within a page.

Accordingly, in various embodiments, one or more different portions of memory array 114 may be determined by DWC device 102 to be error prone including, but not limited to, two or more error prone cells (e.g., cells 200, 202), two or more error prone sub-pages (e.g., sub-pages 808, 810), two or more error prone pages (e.g., pages 800, 802) and/or two or more error prone blocks (e.g., blocks 116, 118) of memory array 114.

Turning now to FIG. 3, DWC device 102 includes a communication component 300, an error analysis and classification (EAC) component 302, a pairing component 304, a single-level cell component 306, a multi-level cell component 308, a memory device 314, a processor 316 and/or a data storage 318. In various embodiments, one or more of communication component 300, EAC component 302, pairing component 304, single-level cell component 306, multi-level cell component 308, memory device 314, processor 316 and/or data storage 318 may be electrically, communicatively and/or otherwise operably coupled to one another to perform one or more functions of DWC device 102.

Communication component 300 may transmit and/or receive information to/from DWC device 102. For example, in some embodiments, communication component 300 may transmit and/or receive data such as data for controlling when to perform differential writing to memory array 114. For example, in some embodiments, information such as one or more threshold values that, if met or exceeded, indicate an error prone portion of memory, may be received by communication component 300.

In some embodiments, communication component 300 may transmit information such as whether a portion of memory array 114 of memory device 104 is error prone (e.g., has a likelihood of error greater than a defined amount or percentage), a number or percentage of portions of memory array 114 that have been classified as error prone or the like.

EAC component 302 may determine whether one or more portions of memory array 114 of memory device 104 are error prone. For example, in some embodiments, EAC component 302 may be configured to evaluate a portion (e.g., cell, block, page) of memory array 114 and determine whether the likelihood of error during reading or writing data to the portion of memory array 114 meets or exceeds a threshold value or otherwise satisfies a condition indicative of the portion being associated with erroneous values that cannot be corrected by ECC. EAC component 302 may make such determinations regarding one or more portions of memory array 114 from time to time, periodically, upon detection of a particular event and/or upon receiving input at communication component 300 causing EAC component 302 to evaluate one or more portions of memory array 114. If EAC component 302 determines that one or more portions of memory array 114 are error prone, EAC component 302 may output a signal.

Pairing component 304 may determine identification of the particular portion of memory array 114 that is error prone and output a signal indicative of the portion of interest. In various embodiments, pairing component 304 may determine one or more pairs of portions of memory array 114 of memory device 104 for differential writing.

For example, with reference again to FIG. 2, EAC component 302 may determine that two blocks of memory array 114 are error prone. Pairing component 304 may determine that blocks 116, 118 are the identities of the error prone portions of memory array 114. In various embodiments, the blocks may be adjacent or non-adjacent one another. The error prone portions may be identified for differential writing in memory device 104.

In other embodiments, pairing component 304 may identify other error prone portions of memory array 114. For example, with reference again to FIG. 8, shown is a page (e.g., page 800, page 802) of memory device within block 116 of memory array 114. Specifically, block 116 is composed of numerous pages although one page is shown. Columns 1 through N/2 represent sub-page 1 at reference numeral 808 while columns N/2+1 through N represent sub-page 2 at reference numeral 810. Sub-page 1 at reference numeral 808 and sub-page 2 at reference numeral 810 combine to represent a page (e.g., page 800, page 812 or page 802) where N=approximately 32.768 cells in this embodiment. Pairing component 304 may determine that two of pages 800, 802, 812 are the identities of the error prone portions of memory array. In various embodiments, the pages may be adjacent or non-adjacent one another. The error prone portions may be identified for differential writing in memory device 104.

In other embodiments, pairing component 304 may identify yet other error prone portions of memory array 114. For example, two sub-pages (e.g., sub-pages 808, 810) of an error prone page and/or error prone block may be paired. For example, a first half and a second half of a page may be paired for differential writing.

In one embodiment, for example, a first apportionment 804 (e.g., ½, ⅓ or another apportionment of page 812 of block 114 of memory device 104 and a second apportionment 806 of page 812 of block 114 of memory device 104). Data may then be divided into a first portion of data and a second portion of data, wherein the first portion of data and the second portion of data are sized to be stored in first apportionment 804 of page 812 and second apportionment 806 of page 812, respectively.

In various embodiments, the first apportionment 804 may be the same as, less than or greater than the second apportionment 806, and the first or second apportionment may change from time to time. For example, the apportionment (portion of the page allocated as a sub-page for writing first or second data) may be a function of the amount of data to be written to the first apportionment or the second apportionment.

In other embodiments, pairing component 304 may identify yet other error prone portions of memory array 114. For example, pairing component 304 may identify two error prone neighboring or non-neighboring error prone cells (e.g., cells 200, 202).

Communication component 300 may output a signal to controller 106 of memory device 104 causing memory device 104 to perform differential writing employing the error prone portions of memory array 114 identified by pairing component 304. Specific control information for performing the differential writing (and later, differential or summation-based reading) may be generated by SLC component 306 for embodiments in which memory array 114 is SLC or MLC component 308 for embodiments in which memory array 114 is MLC.

Turning back to FIG. 3, SLC component 306 controls differential writing and reading from memory array 114 when memory array 114 is SLC memory. MLC component 308 controls differential writing and reading from memory array 114 when memory array 114 is SLC memory. In various embodiments, DWC device 102 may include only SLC component 306, only MLC component 308 and/or a combination of SLC component 306 and MLC component 308, depending on the type of memory array 114.

In some embodiments, SLC component 306 (or MLC component 308) may generate a signal for first data to be mapped to a first portion of the pair of portions identified by pairing component 304. The first data may be the original data intended to be stored in memory array 114. SLC component 306 (or MLC component 308) may generate a signal for second data to be mapped to the second portion of the pair of portions identified by pairing component 304. The second data may be a bit inverted version of the first data.

For example, when writing binary data=1101, on a first error prone block, 1101 may be written, and on the second error prone block, 0010 may be written. As such, the second data is a bit inverted form of the first data. As such, the voltage level to be stored for the second data is the opposite of the voltage levels to be stored for the first data.

Reading the stored data may differ depending on whether the memory array 114 is SLC or MLC. For example, for SLC memory array 114, SLC component 306 may read the written first and second data to determine the original data intended to be written as follows. SLC component 306 may determine the voltage difference between the first data stored at the first block and the second data stored at the second block to read the written data. For example, in one embodiment, SLC component 306 may generate a signal to simply subtract the binary values of the second data from the first data. In the example described, 11(−1)1 may be read, which may be read as 1101. As such, the value written in the first block is retrieved as the difference between the second data and the first data. In practice, it is possible to read from the difference of analog voltage values.

In some embodiments, the data intended to be written may be stored in the second portion of memory array 114 instead of being stored in the first portion, and a bit inverted portion may be stored in the first portion of memory array 114. However, in this embodiment, the first data is subtracted from the second data to obtain the original information intended to be written.

In embodiments in which memory array 114 is MLC, in one embodiment, a difference may be determined between the first data and the second data as described above with reference to SLC memory array embodiments. In other embodiments of MLC memory arrays, summation may be employed to perform reading.

In MLC memory, the range of threshold voltages may be divided into more than two regions, with each region representing more than one bit. For example, in one embodiment, the range of possible threshold voltage values of the cell may be divided into four regions. A voltage value within a first region may represent a "00" value, a voltage value within a second region may represent a "01" value, a voltage value within a third region may represent a "11" value and/or voltage value within a fourth region may represent a "10" value.

In this embodiment, in lieu of the difference approach for reading the value written, MLC component 308 may generate a signal for determining the value written by adding the two voltage values (and thereby receiving 2 volts or 4 volts, as shown in the Sum column of FIG. 7). The flexibility to use a summation method in the MLC embodiments (in addition to, in other embodiments, using a difference method in the MLC embodiments) differs from the methods employed in the SLC embodiments (which employ only difference approaches for reading the data to determine the information to be coded in the memory cell).

Although the above embodiment describes error prone blocks employed in differential writing, any number of different types of portions of memory array 114 may be determined to be error prone. Differential writing may be performed accordingly with different types of portions of memory array 114.

By way of example, but not limitation, with reference to FIGS. 1 and 8, the method of differential writing to two error prone blocks in memory device may be easily varied such as using two pages 802, 804 within a block (e.g., block 114) instead of two blocks. Accordingly, in one pairing option, two error prone pages (e.g., 800, 802) within block 114 of memory device 104 may be paired for differential writing. For example, SLC component 306 (or MLC component 308) may control first data to be written on a first page and second data, a bit inverted representation of the first data, to be written to the second page. The pages need not be adjacent one another.

SLC component 306 may generate a signal for reading by determining the difference between the first data and the second data (subtracting the second data from the first data). As described above, MLC component 308 may generate a signal for reading by performing the difference between the first data and the second data as described with reference to SLC component 306 and/or by performing summation as described above.

As another example, SLC component 306 (or MLC component 308) may control first data to be written to first cell 200 and second data to be written to second cell 202. Second data may be an inverted representation of the first data. In some embodiments, the first data and the second data may be mapped to and/or represent a bit (e.g., "0" or "1") (for SLC embodiments) or a pair of bits (for MLC embodiments).

SLC component 306 may generate a signal for reading by determining the difference between the first data and the second data (subtracting the second data from the first data). As described above, MLC component 308 may generate a signal for reading by performing the difference between the first data and the second data as described with reference to SLC component 306 and/or by performing summation as described above.

In yet another embodiment, SLC component 306 (or MLC component 308) may generate a signal to cause differential writing to be performed within sub-pages of an error prone page. For example, the first portion of data may be written to first apportionment 804 of page 800 and the second portion of the data may be written to second apportionment 806 of page 800. In various embodiments, second portion of data is a bit inverted representation of the first portion of data.

SLC component 306 may generate a signal for reading by determining the difference between the first data and the second data (subtracting the second data from the first data). As described above, MLC component 308 may generate a signal for reading by performing the difference between the first data and the second data as described with reference to SLC component 306 and/or by performing summation as described above.

In the embodiments described, the signal output from SLC component 306 and/or MLC component 308 for differential writing of first data or second data stored in error prone portions of memory array 114 may be received by memory device 104 for controlling writing at memory array 114. By way of example, but not limitation, SLC component 306 or MLC component 308 may output a signal for differential writing of first data and second data to different portions of memory array 114. Writing component 110 may perform the differential writing of data to the portions of memory array 114 identified by pairing component 304.

In the embodiments described, the signal output from SLC component 306 and/or MLC component 308 for differential reading or summation-based reading of first data or second data stored in error prone portions of memory array 114 may be received by memory device 104 for controlling reading at memory array 114. By way of example, but not limitation, SLC component 306 or MLC component 308 may output a signal for differential reading or summation-based reading of first data and second data to different portions of memory array 114. Reading component 112 may perform the differential reading and/or summation-based reading of data from the portions of memory array 114 identified by pairing component 304.

In some embodiments, analog signal processing may be employed to improve error performance in non-volatile (e.g., flash) memory devices. Accordingly, obtaining analog voltage values for the proposed embodiments described herein may be done conveniently. The analog values may be available at least in the dedicated processing stage to improve the memory device. Moreover, the analog voltage may be quantized as higher bit resolutions than the final output number of bits per memory cell in some embodiments. For example, for an embodiment employing MLC memory devices, a level in MLC (e.g., 0, 1, 2, 3) may be represented by quantized higher bit resolution analog voltage values.

Turning back to FIG. 3, memory device 314, processor 316 and/or data storage 318 are included in DWC device 102. Memory device 314 may be a computer-readable storage medium storing computer-executable instructions and/or information for performing the functions described herein with reference to DWC device 102 (or a component of memory device 314). For example, memory device 314 may store computer-executable instructions that may be executed by processor 208 to perform communication, evaluation, decision-making or other types of functions executed by DWC device 102. Processor 316 may perform one or more of the functions described herein with reference to DWC device 102 (or a component of DWC device 102). For example, processor 316 may evaluate whether a portion of memory device 104 is error prone, identify one or more portions of memory device 104 to which to perform differential writing, etc. Any number of different functions described herein for facilitating differential writing to portions of a memory device for memory life extension may be employed utilizing processor 316.

Data storage 318 may be configured to store information accessed, received and/or processed by DWC device 102 (or a component of DWC device 102). For example, data storage 318 may store information regarding one or more values indicating that a portion of memory device 104 is error prone, information identifying one or more portions of memory device to which to perform differential writing or the like.

The proposed method has couple of advantages as compared to the conventional simple repetition. First, there's no need to consider the threshold voltage in the process of reading the voltages representing the first data and the second data stored in memory array 114. Also, the error rate is substantially equal as between the error of misreading "0"

as "1" and misreading "1" as "0," and consequently, this has an effect of significantly lowering the overall error rate.

Figure 4:
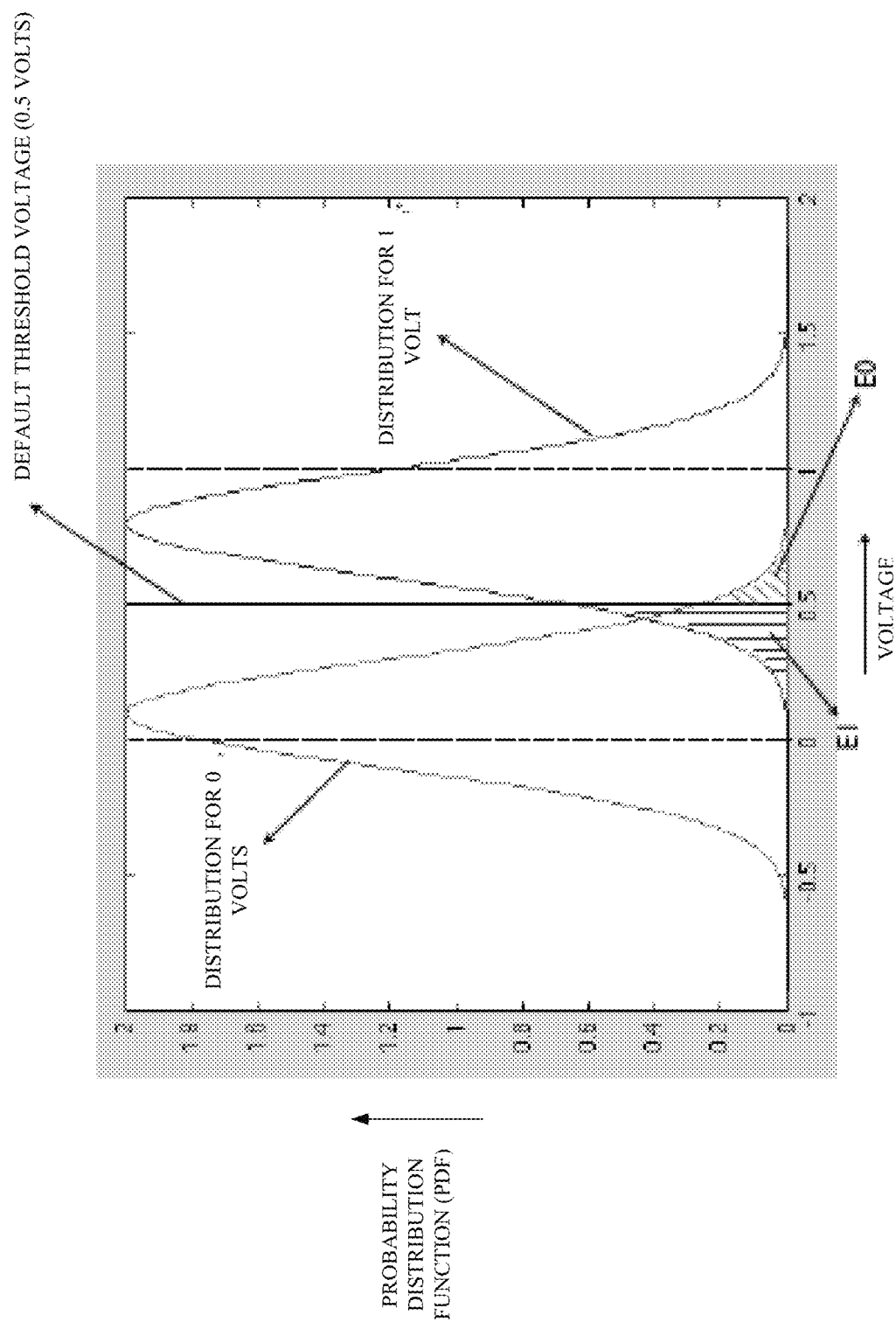
FIG. 4 illustrates an example diagram of a graph of the performance of the device of FIG. 1 configured to facilitate differential writing to portions of memory device for memory life extension in accordance with one or more embodiments described herein.

FIG. 4 illustrates an example diagram of a graph of the performance of the device of FIG. 1 configured to facilitate differential writing to portions of memory device for memory life extension in accordance with one or more embodiments described herein. Shown is the graph of probability distribution functions (PDFs) for 0 volts and for 1 volt for different voltage values. The default threshold voltage is 0.5 volts and regions E1 and E0 are as shown and described in greater detail with reference to FIG. 5. E0 indicates the error of the "0" bit being erroneously determined to be the "1" bit and where E1 indicates the error of the "1" bit being erroneously determined to be the "0" bit. For ease of explanation, a SLC memory device may be assumed in which the voltage value of 0 volts is used for the assignment of the "0" bit and the voltage value of 1 volt is used for the assignment of the "1" bit. Also, it may be assumed that the error due to various factors changes to mean=0.1 and standard deviation=0.2 for the value "0" bit and the error has a normal distribution of mean=0.8 and standard deviation=0.2 for the value "1" bit. Due to those errors, the original detection method of simple replication of the same data in error prone memory device results in an error rate for the "0" value=0.0227 and results in an error rate of "1" value=0.0667, respectively, in the detection of the "0" bit and "1" bit by a default threshold voltage=0.5 volts as shown in FIG. 4.

FIG. 5 illustrates an example set of simulation results for the device of FIG. 1 configured to facilitate differential writing to portions of memory device for memory life extension in accordance with one or more embodiments described herein. In FIG. 5, as with FIG. 4, E0 indicates the error of the "0" bit being erroneously determined to be the "1" bit and where E1 indicates the error of the "1" bit being erroneously determined to be the "0" bit. For such error prone blocks, when replacing them through repetition, error rates are 0.0023 and 0.0169, respectively and it has an effect of reducing bit error although double the number of blocks used. As such, while the embodiment described uses more capacity, the error rate goes down and the block that would have been previously discarded may now be used. The proposed method has an effect of reducing the bit error rate by approximately 30.2% as compared to the conventional simple repletion of the same data in two error prone blocks.

In the above, for ease of explanation, a case of writing bit inverted (e.g., flipped) values in two error prone memory device blocks is taken as an example for the SLC case of memory device. However, in other embodiments, the method may be applied for MLC such as described with reference to FIGS. 7 and 8 (or, in other embodiments, TLC (three bits per cell)).

Figure 6:
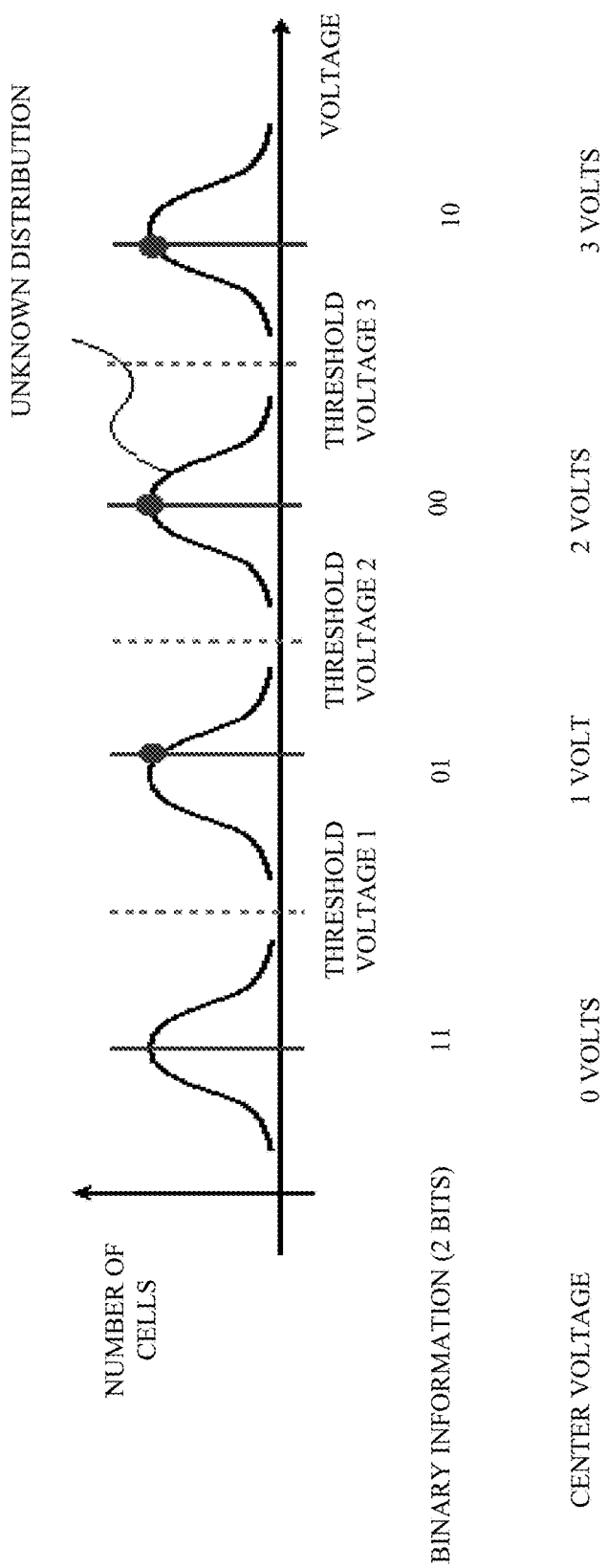
FIG. 6 illustrates an example graph of distributions for voltage per number of cells for the device of FIG. 1 configured to facilitate differential writing to portions of memory device for memory life extension for multi-level cell (MLC) memory devices in accordance with one or more embodiments described herein.

FIG. 6 illustrates an example graph of distributions for voltage per number of cells for the device of FIG. 1 configured to facilitate differential writing to portions of memory device for memory life extension for MLC memory devices in accordance with one or more embodiments described herein. FIG. 7 illustrates an example table depicting example values for differential reading and summation-based reading of data and corresponding performance results for MLC memory devices in accordance with one or more embodiments described herein.

In embodiments employing MLC memory devices, the devices contain two bits per cell, and there are four levels in an MLC. As illustrated below in FIG. 7, if we write two bit value "11" in one cell, and the flipped value "00" in the other cell. Since the level is assigned based on the gray coding scheme (e.g., the voltage value for "11" is 0 volts, the voltage value for "00" is 2 volts, etc.). Similarly in SLC, the least significant bit (LSB) information may be identified by computing the difference between the voltage values for two cells. For example, the voltage values may be mapped to one of voltage value −2 volts or +2 volts (as shown in the Diff column of FIG. 7).

FIG. 7 illustrates an example graph of distributions for voltage per number of cells for the device of FIG. 1 and configured to facilitate differential writing to portions of memory device for memory life extension for MLC memory devices in accordance with one or more embodiments described herein. In embodiments employing MLC memory devices, the devices contain two bits per cell, and there are four levels in an MLC. As illustrated below in FIG. 7, if we write two bit value "11" in one cell, and the flipped value "00" in the other cell. Since the level is assigned based on the gray coding scheme (e.g., the voltage value for "11" is 0 volts, the voltage value for "00" is 2 volts, etc.). Similarly in SLC, the least significant bit (LSB) information may be identified by computing the difference between the voltage values for two cells. For example, the voltage values may be mapped to one of voltage value −2 volts or +2 volts (as shown in the Difference column of FIG. 7).

In another embodiment, in lieu of the difference approach for reading the value written, the value written may be determined by adding the two voltage values (and thereby receiving 2 volts or 4 volts, as shown in the Summation column of FIG. 7). The flexibility to use a summation method in the MLC embodiments (in addition to, in other embodiments, using a difference method in the MLC embodiments) differs from the methods employed in the SLC embodiments (which employ only difference approaches for reading the data to determine the information to be coded in the memory cell).

Figure 9:
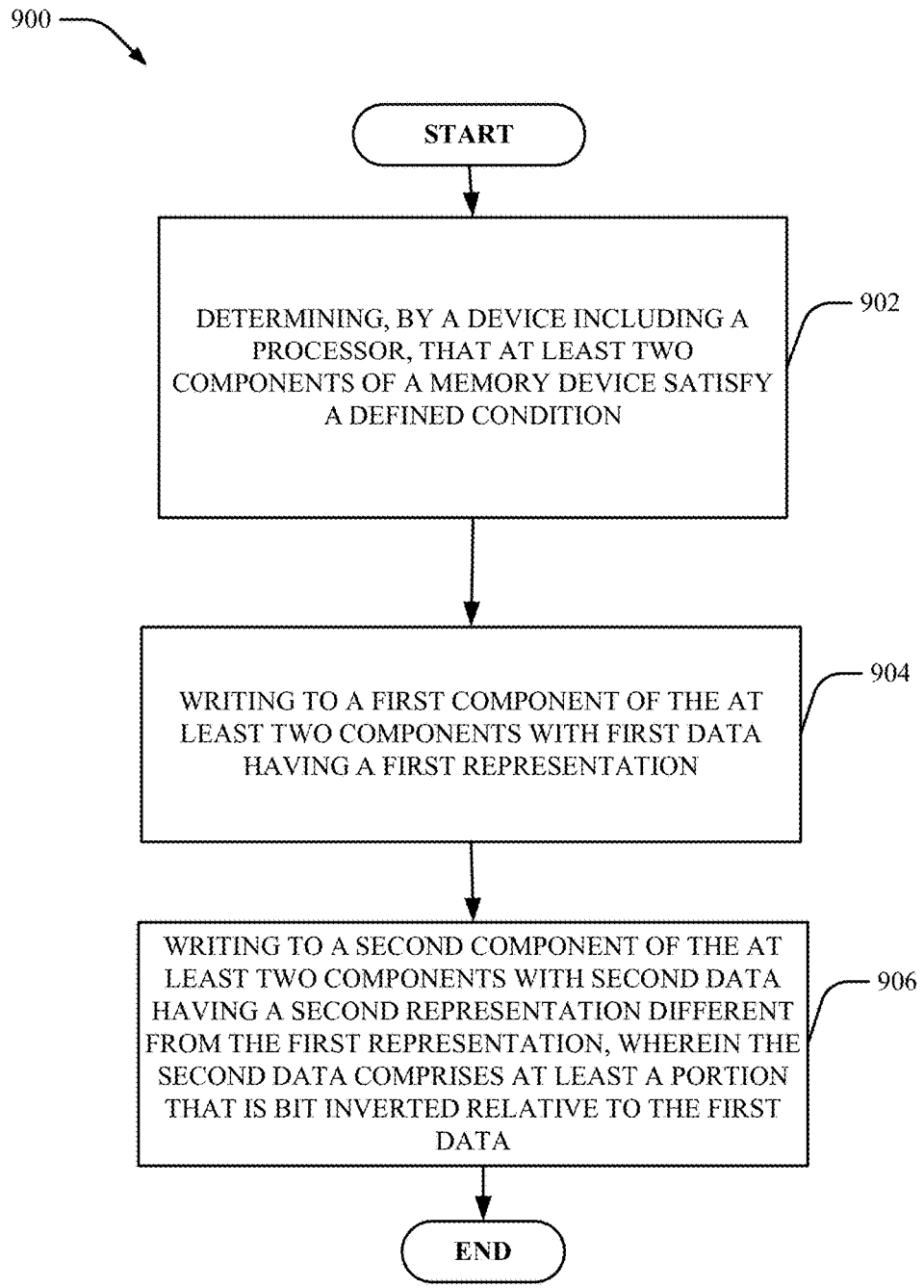
FIGS. 9-11 illustrate example flowcharts of methods associated with differential writing to portions of memory device for memory life extension in accordance with one or more embodiments described herein.
Figure 10:
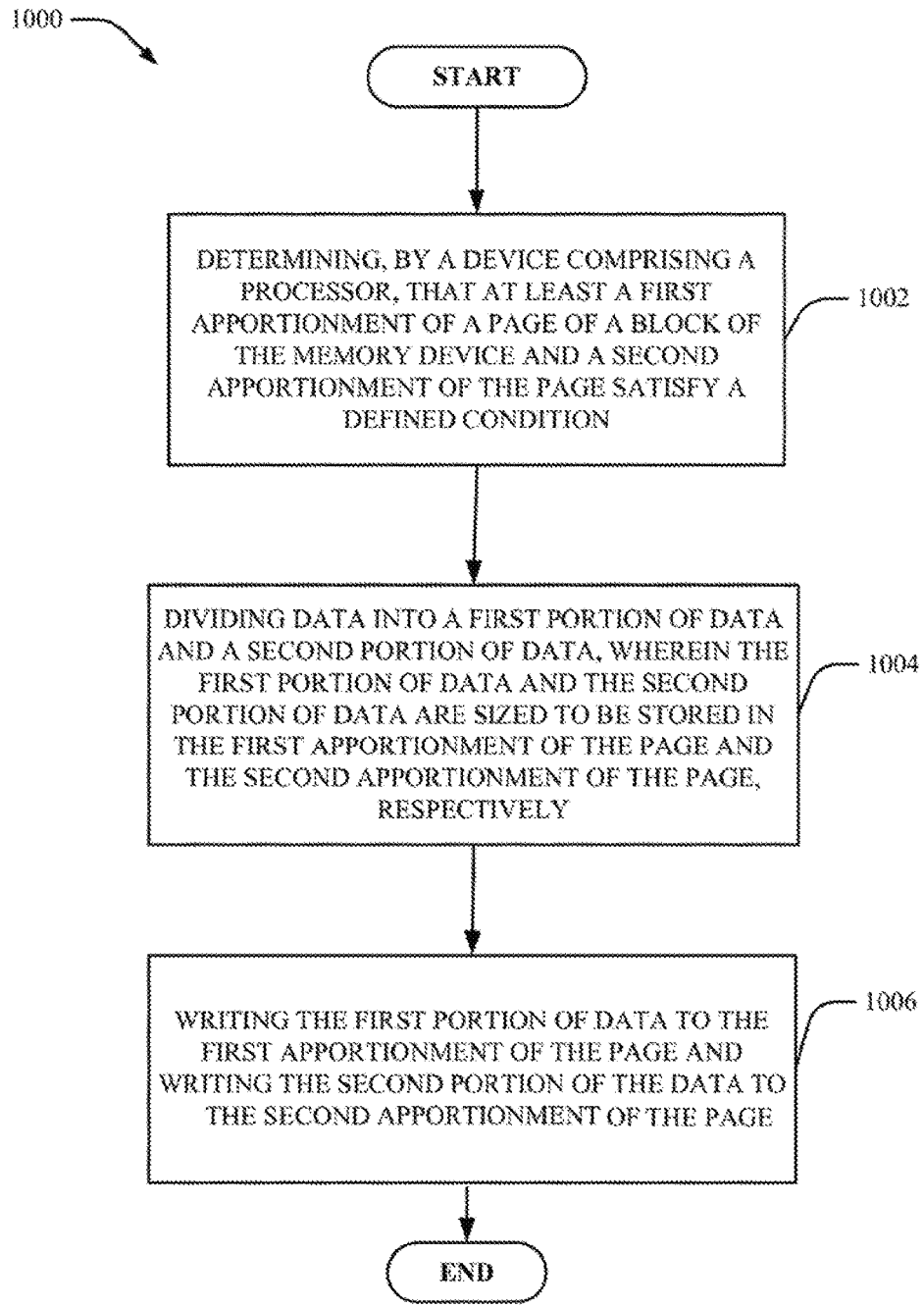
Figure 11:
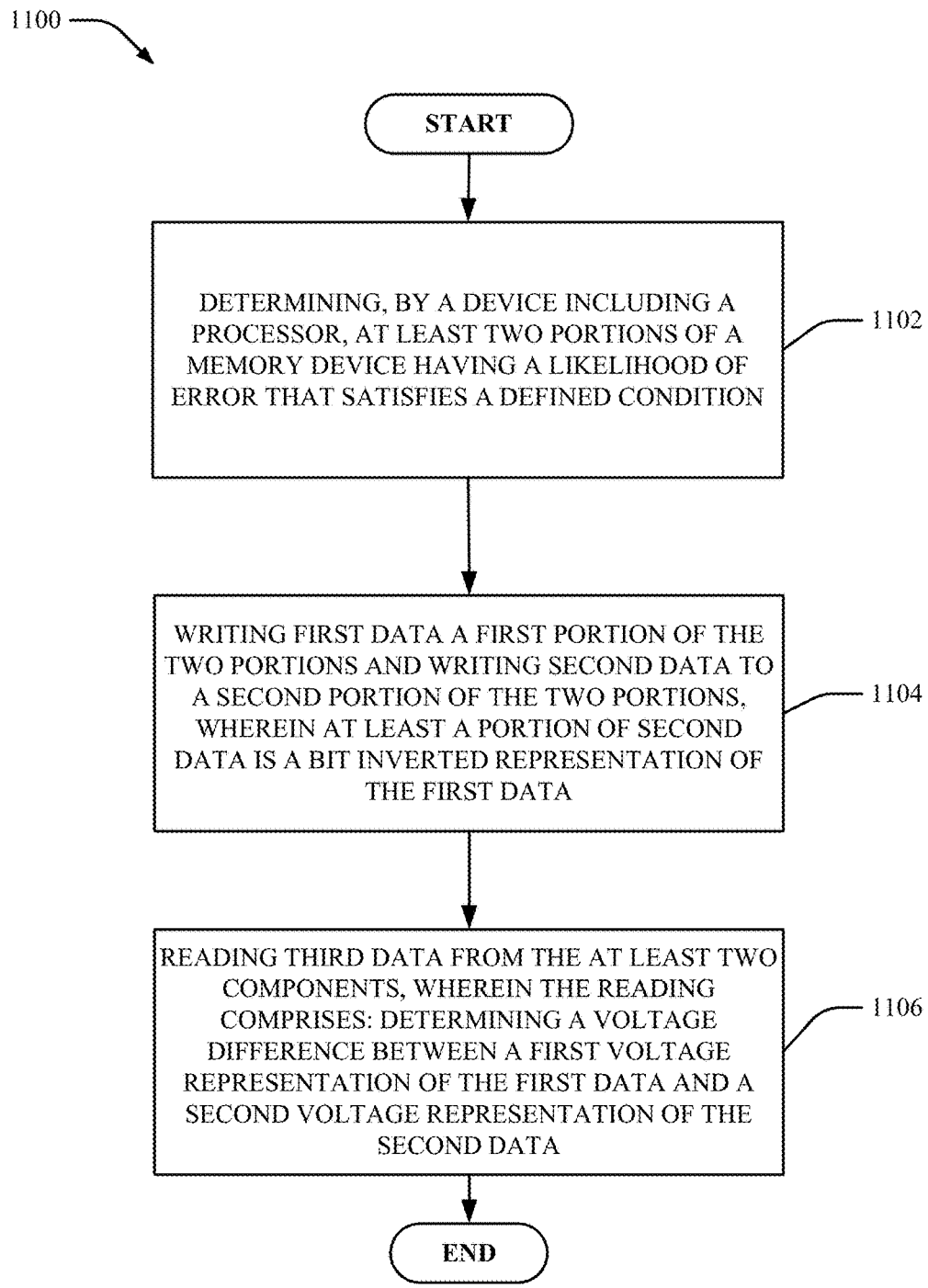

FIGS. 9-11 illustrate example flowcharts of methods associated with differential writing to portions of memory device for memory life extension in accordance with one or more embodiments described herein. Turning first to FIG. 9, at a block 902, a method 900 includes determining, by a device including a processor, that at least two components of a memory device satisfy a defined condition (e.g., using DWC device 102). Block 902 may be followed by a block 904. At block 904, method 900 includes writing to a first component of the at least two components with first data having a first representation (e.g., using writing component 110). Block 904 may be followed by a block 906. At block 906, method 900 includes writing to a second component of the at least two components with second data having a second representation different from the first representation, wherein the second data comprises at least a portion that is bit inverted relative to the first data (e.g., using writing component 110).

Now turning to FIG. 10, at a block 1002, a method 1000 may include determining, by a device including a processor, that at least a first apportionment of a page of a block of the memory device and a second apportionment of the page satisfy a defined condition (e.g., using EAC component 302). Block 1002 may be followed by a block 1004. At block 1004, method 1000 may include dividing data into a first portion of data and a second portion of data, wherein the first portion of data and the second portion of data are sized to be stored in the first apportionment of the page and the second apportionment of the page, respectively (e.g., using pairing component 304). For example, the first apportionment and/or the second apportionment may be one half the page. Block 1004 may be followed by a block 1006. At block

1006, method 1000 may include writing the first portion of data to the first apportionment of the page and writing the second portion of the data to the second apportionment of the page (e.g., using writing component 110).

Now turning to FIG. 11, at a block 1102, a method 1100 may include determining, by a device including a processor, at least two portions of a memory device having a likelihood of error that satisfies a defined condition (e.g., using EAC component 302). Block 1102 may be followed by a block 1104. At block 1104, method 1100 may include writing first data a first portion of the two portions and writing second data to a second portion of the two portions, wherein at least a portion of second data is a bit inverted representation of the first data (e.g., using writing component 110). Block 1104 may be followed by a block 1106. At block 1106, method 1100 may include reading third data from the at least two components, wherein the reading includes determining a voltage difference between a first voltage representation of the first data and a second voltage representation of the second data (e.g., using reading component 112).

Figure 12:
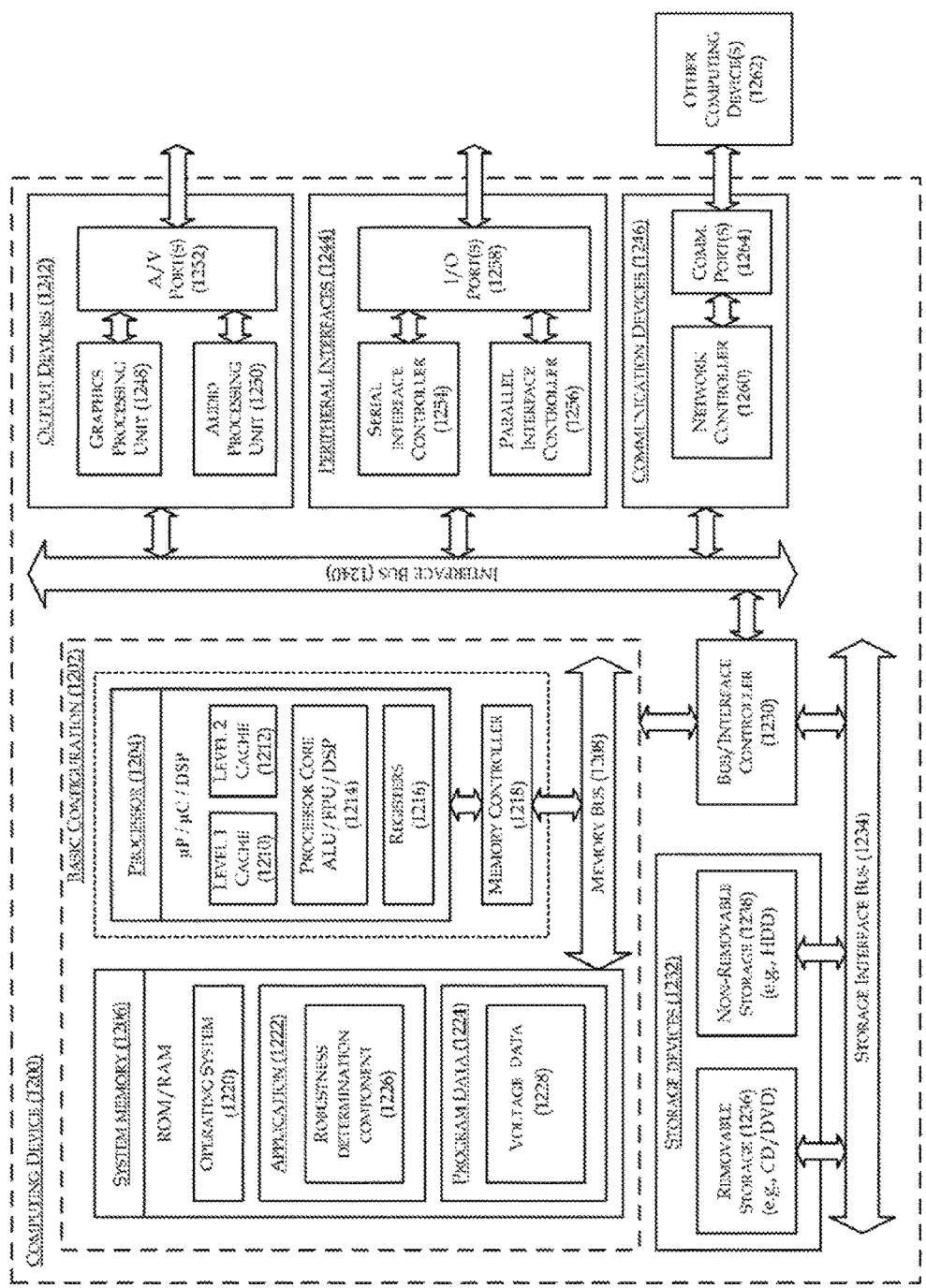
FIG. 12 illustrates an example block diagram of a computing device that is arranged for differential writing to portions of memory device for memory life extension in accordance with one or more embodiments described herein.

FIG. 12 is a block diagram illustrating an example computing device 1200 that is arranged for determination of circuit robustness in accordance with the present disclosure. In a very basic configuration 1202, computing device 1200 typically includes one or more processors 1204 and a system memory 1206. In some embodiments, system memory 1206 may be or include memory device 104. A memory bus 1208 may be used for communicating between a processor 1204 and system memory 1206.

Depending on the desired configuration, processor 1204 may be of any type including but not limited to a microprocessor (μP), a microcontroller C), a digital signal processor (DSP), or any combination thereof. Processor 1204 may include one more levels of caching, such as a level one cache 1210 and a level two cache 1212, a processor core 1214, and registers 1216. An example processor core 1214 may include an arithmetic logic unit (ALU), a floating point unit (FPU), a digital signal processing (DSP) core, or any combination thereof. An example memory controller 1218 may also be used with processor 1204, or in some implementations a memory controller 1218 may be an internal part of processor 1204.

Depending on the desired configuration, system memory 1206 may be of any type including but not limited to volatile memory (such as RAM), non-volatile memory (such as ROM, flash memory, etc.) or any combination thereof. System memory 1206 may include an operating system 1220, one or more applications 1222, and program data 1224. In some embodiments, computing device 1200 may be or be included in DWC device 102. In some embodiments, application 1222 (which may include a robustness determination component 1226) may be arranged to operate with program data 1224 (which may include voltage data 1228) on operating system 1220 such that differential writing may be performed as described herein. This described basic configuration 1202 is illustrated in FIG. 12 by those components within the inner dashed line.

Computing device 1200 may have additional features or functionality, and additional interfaces to facilitate communications between basic configuration 1202 and any required devices and interfaces. For example, a bus/interface controller 1230 may be used to facilitate communications between basic configuration 1202 and one or more data storage devices 1232 via a storage interface bus 1234. Data storage devices 1232 may be removable storage devices 1236, non-removable storage devices 1238, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

System memory 1206, removable storage devices 1236 and non-removable storage devices 1238 are examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which may be used to store the desired information and which may be accessed by computing device 1200. Any such computer storage media may be part of computing device 1200.

Computing device 1200 may also include an interface bus 1240 for facilitating communication from various interface devices (e.g., output devices 1242, peripheral interfaces 1244, and communication devices 1246) to basic configuration 1202 via bus/interface controller 1230. Example output devices 1242 include a graphics processing unit 1248 and an audio processing unit 1250, which may be configured to communicate to various external devices such as a display or speakers via one or more A/V ports 1252. Example peripheral interfaces 1244 include a serial interface controller 1254 or a parallel interface controller 1256, which may be configured to communicate with external devices such as input devices (e.g., keyboard, mouse, pen, voice input device, touch input device, etc.) or other peripheral devices (e.g., printer, scanner, etc.) via one or more I/O ports 1258. An example communication device 1246 includes a network controller 1260, which may be arranged to facilitate communications with one or more other computing devices 1262 over a network communication link via one or more communication ports 1264.

Computing device 1200 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1200 may also be implemented as a personal computer including both laptop computer and non-laptop computer configurations.

A network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

In an illustrative embodiment, any of the operations, processes, etc. described herein may be implemented as computer-readable instructions stored on a computer-readable medium. The computer-readable instructions may be executed by a processor of a mobile unit, a network element, and/or any other computing device.

The use of hardware or software may be generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples can be implemented, individually and/or collectively, by a wide range of hardware, software, firmware, or virtually any combination thereof. In one embodiment, several portions of the subject matter described herein can be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be possible in light of this disclosure. In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive (HDD), a compact disk (CD), a digital versatile disc (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. A typical data processing system may generally include one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system can be implemented utilizing any suitable commercially available components, such as those typically found in data computing/communication and/or network computing/communication systems.

The herein described subject matter sometimes illustrates different components contained within, or connected with, different other components. Such depicted architectures are merely examples, and many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality, and any two components capable of being so associated can also be viewed as being "operably coupleable," to each other to achieve the desired functionality. Specific examples of operably coupleable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations can be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims can contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

The present disclosure is not to be limited in terms of the particular embodiments described in this application, which are intended as illustrations of various aspects. Many modifications and variations can be made without departing from its spirit and scope. Functionally equivalent methods and devices within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled. This disclosure is not limited to particular methods, computer-readable storage devices, systems or apparatus disclosed, which can, of course, vary. The terminology used herein is for the purpose of describing particular embodiments only, and is not intended to be limiting.

What is claimed is:

1. A method, comprising:
    determining, by a device comprising a processor, that at least two components of a memory device satisfy a defined condition;
    writing to a first component of the at least two components with first data that has a first representation; and
    writing to a second component of the at least two components with second data that has a second representation different from the first representation, wherein a first value of the second data is bit inverted relative to a second value of the first data, and wherein the first value and the second value are located in a same position within the second data and the first data, respectively.

2. The method of claim 1, wherein the at least two components comprise a first storage block and a second storage block of the memory device.

3. The method of claim 1, wherein the determining comprises determining that the at least two components of the memory device comprise a number of error-prone cells determined to exceed a limit of correction capability.

4. The method of claim 3, wherein the limit of correction capability is based on an error correction coding for the at least two components.

5. The method of claim 1, further comprising:
    reading third data from the at least two components, wherein the reading comprises:
        determining a voltage difference between a first voltage representation of the first data and a second voltage representation of the second data.

6. The method of claim 5, wherein the voltage difference includes a bitwise voltage difference.

7. The method of claim 1, wherein the memory device comprises a non-volatile memory device.

8. The method of claim 1, wherein the memory device comprises a single level cell memory device.

9. The method of claim 1, wherein the memory device comprises a multi-level cell memory device.

10. The method of claim 1, wherein the at least two components comprise a first page portion and a second page portion within a block of the memory device.

11. The method of claim 10, wherein the first page portion and the second page portion are non-adjacent to one another.

12. An apparatus, comprising:
    an error analysis and classification component configured to determine that at least two components of a memory device satisfy a defined condition; and
    a writing component configured to:
        write to a first component of the at least two components with first data that has a first representation; and
        write to a second component of the at least two components with second data that has a second representation, wherein a first value of the second data is bit inverted relative to a second value of the first data, and wherein the first value and the second value are located in corresponding positions within the second data and the first data, respectively.

13. The apparatus of claim 12, wherein the at least two components comprise a first storage block and a second storage block of the memory device.

14. The apparatus of claim 12, wherein the at least two components of the memory device are determined to satisfy the defined condition based on a number of error-prone cells that exceed a defined number for the memory device.

15. The apparatus of claim 14, wherein the defined number is based on an error correction coding for the at least two components.

16. The apparatus of claim 12, further comprising:
    a reading component configured to read third data from the at least two components based on a determination of a voltage difference between a first voltage representation of the first data and a second voltage representation of the second data.

17. The apparatus of claim 16, wherein the voltage difference includes a bitwise voltage difference.

18. The apparatus of claim 12, wherein the memory device comprises a multi-level cell memory device, the first data comprises two first values, the second data comprises two second values, and the two second values are the bit inverted representation of the two first values.

19. A method, comprising:
  determining, by a device comprising a processor, that at least a first apportionment of a page of a block of the memory device and a second apportionment of the page satisfy a defined condition;
  dividing data into a first portion of data and a second portion of data; and
  writing the first portion of data to the first apportionment of the page and writing the second portion of the data to the second apportionment of the page, wherein the first apportionment comprises one half of the page.

20. The method of claim 19, wherein the first portion of data and the second portion of data are sized to be stored in the first apportionment of the page and the second apportionment of the page, respectively.

\* \* \* \* \*

UNITED STATES PATENT AND TRADEMARK OFFICE
CERTIFICATE OF CORRECTION

| | |
|---|---|
| PATENT NO. | : 9,646,699 B2 |
| APPLICATION NO. | : 14/404002 |
| DATED | : May 9, 2017 |
| INVENTOR(S) | : Oh et al. |

It is certified that error appears in the above-identified patent and that said Letters Patent is hereby corrected as shown below:

In the Specification

In Column 13, Line 32, delete "microcontroller C)," and insert -- microcontroller (μC), --, therefor.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*